(12) United States Patent
Joly

(10) Patent No.: US 7,265,627 B2
(45) Date of Patent: Sep. 4, 2007

(54) SELF ADAPTABLE BIAS CIRCUIT FOR ENABLING DYNAMIC CONTROL OF QUIESCENT CURRENT IN A LINEAR POWER AMPLIFIER

(75) Inventor: Christophe Joly, Basking Ridge, NJ (US)

(73) Assignee: NXP B.V., Eindhoven (NL)

( * ) Notice: Subject to any disclaimer, the term of this patent is extended or adjusted under 35 U.S.C. 154(b) by 160 days.

(21) Appl. No.: 10/538,347

(22) PCT Filed: Nov. 28, 2003

(86) PCT No.: PCT/IB03/05515

§ 371 (c)(1),
(2), (4) Date: Jun. 10, 2005

(87) PCT Pub. No.: WO2004/055972

PCT Pub. Date: Jul. 1, 2004

(65) Prior Publication Data

US 2006/0114062 A1    Jun. 1, 2006

Related U.S. Application Data

(60) Provisional application No. 60/433,742, filed on Dec. 16, 2002.

(51) Int. Cl.
*H03G 3/10* (2006.01)

(52) U.S. Cl. .................................................. 330/285
(58) Field of Classification Search ................ 330/285, 330/296
See application file for complete search history.

(56) References Cited

U.S. PATENT DOCUMENTS

| 5,532,646 | A | 7/1996 | Aihara |
| 6,233,440 | B1 * | 5/2001 | Taylor ..................... 455/127.2 |
| 6,304,145 | B1 * | 10/2001 | Laureanti et al. ........... 330/285 |
| 6,445,247 | B1 | 9/2002 | Walker |
| 6,448,855 | B1 * | 9/2002 | Sowlati et al. .............. 330/279 |
| 6,559,722 | B1 | 5/2003 | Lopez |
| 6,653,902 | B1 * | 11/2003 | Bachhuber et al. ......... 330/285 |

(Continued)

FOREIGN PATENT DOCUMENTS

EP      0854 569 A1    7/1998

(Continued)

OTHER PUBLICATIONS

U.S. Appl. No. 60/433,752.

*Primary Examiner*—Robert Pascal
*Assistant Examiner*—Hieu Nguyen

(57) ABSTRACT

A radio frequency (RF) linear power amplifier having an output transistor, and including a circuit means for generating a bias signal producing a quiescent current flowing through the output transistor, a detector circuit for detecting RF input to the amplifier and generating a driving signal according to a power level of the RF input; and a self-adaptable circuit for receiving the driving signal and automatically modifying the bias signal and the quiescent current through the output transistor. The quiescent current at the output stage is reduced and optimized for minimum dissipation and optimal linearity at all power output levels. The bias circuit for the radio frequency (RF) linear power amplifier includes a self-adaptable circuit that dynamically modifies the quiescent current for an output stage amplifier by automatically tracking an RF signal input to the amplifier at power ranges above a certain power output threshold.

10 Claims, 7 Drawing Sheets

U.S. PATENT DOCUMENTS 6,710,649 B2 * 3/2004 Matsumoto et al. .... 330/124 R
6,778,018 B2 8/2004 Joly
2002/0171483 A1 11/2002 Shinjo

FOREIGN PATENT DOCUMENTS

| | | | |
|---|---|---|---|
| EP | 1 298 793 A1 | 4/2003 | |
| WO | WO 02/03543 A1 | 1/2002 | |
| WO | WO 02/065652 A1 | 8/2002 | |

* cited by examiner

SELF ADAPTABLE BIAS CIRCUIT FOR ENABLING DYNAMIC CONTROL OF QUIESCENT CURRENT IN A LINEAR POWER AMPLIFIER

CROSS REFERENCE TO RELATED APPLICATION

This application claims the benefit of U.S. provisional application Ser. No. 60/433,742 filed Dec. 16, 2002, which is incorporated herein by reference.

The present invention relates to commonly-owned, co-pending U.S. Patent Application titled, "Sliding Bias Circuit For Enabling Dynamic Control of Quiescent Current of a Linear Power Amplifier," application Ser. No. 10/538,348, filed on Jun. 10,2005, the subject matter of which is wholly incorporated by reference herein.

The present invention relates generally to radio frequency (RF) power amplifiers, and, more specifically to a self-adapting bias circuit for a linear radio frequency (RF) power amplifier for communication devices.

Traditional biasing techniques for Power non-switching Amplifiers (P.A.) comes from the use of a static quiescent current point Icq that provide amplification of current on the whole sine wave (Class A), a partial sine wave (AB), only half (B) or even less (C). The linearity performance of those amplifiers is inversely related to the obtained efficiency as well as the quiescent point. Class AB bias circuits have been used ever increasingly in the past 10 years as they provide a compromise between linearity and efficiency as compared to other Class A, B power amplifiers which exhibit less efficient and/or non-linear characteristics. They involve biasing the P.A. at a relatively low Icq point but not zero to maintain linearity (quiescent current at the collector of the transistor device) and current increases as power level increases. To work properly, the bias circuit needs to present a very low impedance at base band. This is to avoid the amplifier's AM or PM characteristics to be pulled by the bias circuit, creating linearity deterioration.

By nature of the CDMA and WCDMA systems, CDMA Power Amplifiers operate over a broad dynamic range with a relatively good linearity to meet spectrum requirements, but also to retain the quality of the data stream.

FIG. 1 illustrates a graph 12 of the power used versus the power delivered, i.e., curve represents probability of occurrence of power level when operating in the field, with most power in use concentrated about the 3 dBm point 15 for example, but not at maximum power level or lowest power level. Additionally superimposed on the graph 12 are curves 20 showing the current dissipated by the power amplifier at the power level that's specified. Several schemes are shown in FIG. 1 whereby, a first scheme shows a curve 22 representing a fixed bias of 2.8 volts and a constant quiescent current. As the quiescent level is determined by the performance at the highest power level, power dissipated for bias scheme represented by curve 22 is worst case for all power output levels. In another curve 24, the bias is manually modified, e.g., at 15 dBm, and in another curve 26, the current is also changed at 5 dBm output power. In a better curve 28, the bias is adjusted dynamically and referred to as a "sliding bias" curve. The best curve 30 shown implements a dc-to-dc converter circuit in the phone to reduce collector voltage in the output transistor device and thus, shows the lowest current use at the higher power levels. It is apparent that as the power increases, the current dissipated is increasing with increased power levels.

FIG. 2 illustrates a graph 35 depicting the dissipation of power (integrating over all power levels with the current) for each of the curves shown in FIG. 1.

Thus, in view of FIG. 1, there is recognized the importance of reducing the current at all power levels, e.g., that are not at maximum power levels, most of the time. The ever-increased importance of the current consumption in the Power Amplifiers requires ever-increased efficiency at all power levels. The importance of current consumption has lead Power Amplifier (P.A.) designers to primarily use Class AB biasing techniques.

When the CDMA P.A. is operating primarily at relatively low power levels (compared to the maximum power required (about 20 to 30 dB less)), the current consumption equals the quiescent current. With 2.5 G systems, the advent of data transmission in phones as opposed to voice transmission makes the puncturing of the PA's during data stream much more infrequent (puncturing is allowed by voice compression).

Those factors being considered, to increase phone talk time, there is an added emphasis on reducing the Icq (quiescent current) of the Power Amplifier of the future.

The Power Amplifier (P.A.) of the future is a Class AB that needs to provide linearity with an Icq near or equal to zero to provide maximized efficiency at all power levels on a 60 dB dynamic range. However, the operation of the Power amplifier at the highest power level is one primary Icq requirement.

To meet both requirements, several schemes to date have been employed, including, as shown in FIGS. 1 and 2: use of a DC/DC converter, or use of two operating modes to accommodate for high and low power. Various methods can be used to accommodate low and high power levels: switching between two bias current levels, switching between RF line-ups, gain stage bypassing, load switch; the most often being used alternative bias levels.

This sliding bias technique mentioned hereinabove implements a bias circuit that has a near zero impedance or even slightly negative impedance versus power to provide added currents at high power levels. However, this technique has been extremely difficult to implement Of all methods, the use of a DC/DC converter yields the best performance, however at a high cost and complexity. To date the usual mean of managing the dissipation issue has been switching between two quiescent currents. However this is becoming insufficient for tomorrow's more competitive requirements.

It would thus be highly desirable to provide a "self-adapting bias" circuit for a linear power amplifier used in wireless applications that provides optimum efficiency and linearity within the whole dynamic range.

It is an object of the present invention to provide a novel circuit optimized for use reducing amount of quiescent current consumed in a Power Amplifier output stage.

It is another object of the present invention to provide a power amplifier for use in wireless phone and like communications systems employing but not limited to, Code Division Multiple Access (CDMA), WCDMA, and other modulation schemes implementing a novel circuit for optimizing the quiescent current utilized at all power levels.

It is a further object of the present invention to provide a novel bias circuit optimized for use in reducing amount of quiescent current consumed in a Power Amplifier output stage implemented in an integrated circuit.

It is another object of the invention to provide a novel bias circuit optimized for use in reducing amount of quiescent current consumed in a Power Amplifier output stage implemented in an integrated circuit that implements InGaP HBT or other Bipolar transistors including but not limited to: Si-BJT, GaAs-HBT, InP-HBT, SiGe-HBT circuit devices or similar device technology.

It is yet a further object of the present invention to provide a linear power amplifier including circuitry optimized for minimum dissipation and optimal linearity.

In accordance with the principles of the invention, there is provided a linear power amplifier operating in an output frequency band, having an output transistor, the power amplifier comprising:

a circuit means for generating a bias signal producing a quiescent current flowing through said output transistor of said power amplifier;

a detector circuit means for detecting input to said amplifier and generating a driving signal according to a power level of said input; and a self-adapting bias circuit means for receiving said driving signal and automatically modifying said bias signal and said quiescent current through said output transistor, whereby said quiescent current of said output stage is reduced and optimized for minimum dissipation and optimal linearity at all power output levels.

In a preferred embodiment embodiment, the bias circuit means is provided in a radio frequency (RF) linear power amplifier implemented for wireless communication devices includes a self-adapting circuit that dynamically controls quiescent current for an output stage amplifier that automatically tracks an RF signal being input to the amplifier at power ranges above a certain power output threshold.

Advantageously, the present invention includes a circuit for reducing amount of quiescent current consumed in a Power Amplifier operating in Class AB. It is preferably implemented in wireless phone and like communications devices operating in accordance with, but not limited to, CDMA, WCDMA or other modulated systems.

These and other features, aspects, and advantages of the apparatus and methods of the present invention will become better understood with regard to the following description, appended claims, and accompanying drawings where:

Figure 3:
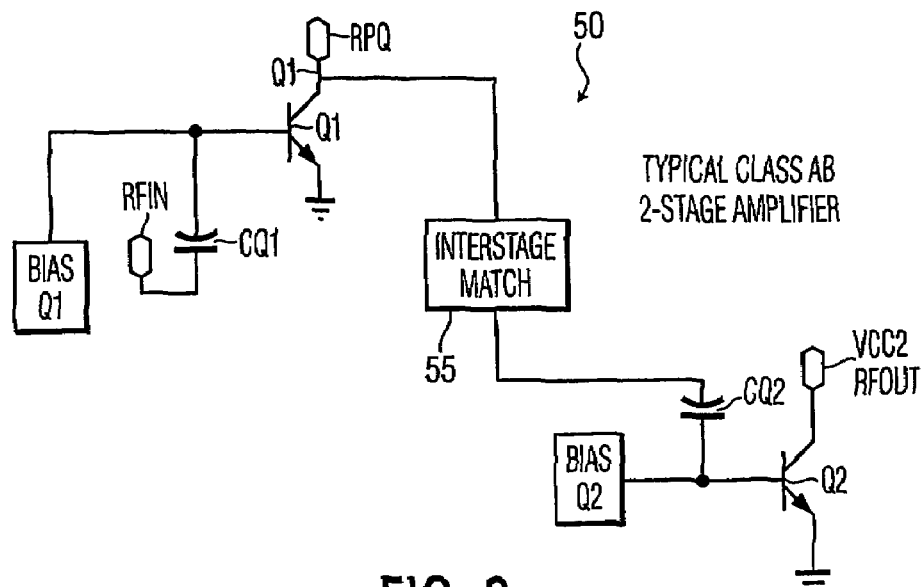
FIG. 3 illustrates a two-stage class AB type power amplifier.

FIG. 3 illustrates a class AB type power amplifier 50 implementing as N-type bias circuit. Such a circuit is disclosed in commonly-owned, co-pending U.S. patent application Ser. No. 10/189,233 entitled IMPROVED LINEAR POWER AMPLIFIER, the whole contents and disclosure of which are incorporated by reference as if fully set forth herein. Basically, this class AB type power amplifier 50 is shown as a two stage having output gain transistors Q1, Q2 each with a respective coupling capacitor CQ1 and C Q2 for coupling the RF signal and each with its own bias circuit Bias Q1 and Bias Q2, respectively, which dynamically or automatically functions to keep the operating quiescent current (Icq) constant depending upon changing operating conditions and power operations. The RF input is shown coupled to the Q1 gain transistor via the C Q1. The first stage Q1 is matched to the second stage via an interstage impedance matching circuit 55 to optimize the two stage configuration.

Figure 4:
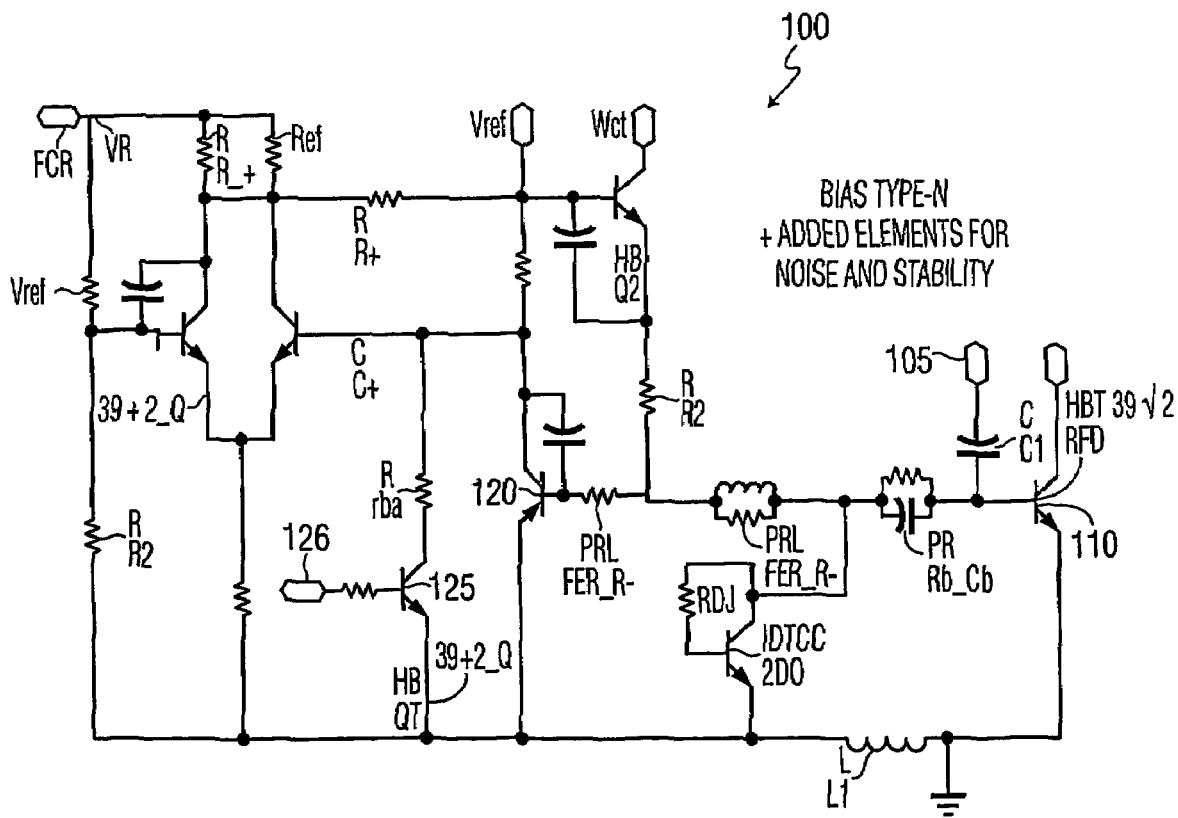
FIG. 4 illustrates a detailed example of a class AB type power amplifier 100 including output stage 110 with its Class AB bias circuit.

FIG. 4 illustrates an example class AB type power amplifier 100 which may comprise either one of the stages shown in the exemplary circuit of FIG. 3 and, is described in commonly-owned, co-pending U.S. patent application Ser. No. 10/189,233. For example, there is depicted an RF input 105, an output transistor 110 (e.g., Q1 or Q2) and a static bias current circuit such that the bias current is going to be constant regardless of operating of temperature, variation of RF signal input, etc. The bias circuit basically comprises a current mirror circuit including a transistor 120 that maintains a collector current that mirrors the collector current of the RF output transistor device. In effect, the quiescent current is determined by the current through the transistor 120. On a multistage amplifier this circuit can be used on any stage. The advantage is a temperature stable bias current. The control loop allows the current to be monitored closely and Icq can be minimized as much as possible. Further provided is a Vmode transistor 125 which is a transistor having a voltage ("V-mode") input 126 which operates under system control (not shown) to discretely modify the quiescent current between two different levels depending upon the V-mode voltage applied. This produces a power dissipation curve such as curve 24 shown in FIGS. 1 and 2.

Figure 5:
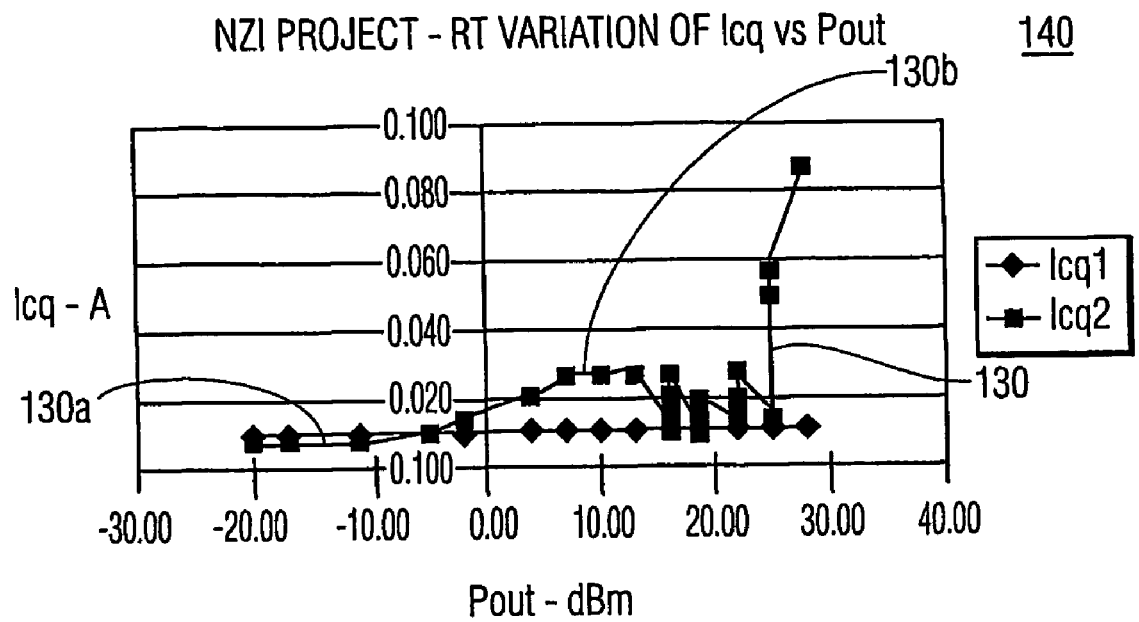
FIG. 5 illustrates a plot indicating the optimal behavior of a varying Icq vs. output power level (Pout).

For an example P.A. such as shown in FIG. 4, a plot indicating the optimal behavior of a varying Icq vs. output power level (Pout) was determined and results set forth in FIG. 5. In the determination, InGaP and AlGaAs devices have been evaluated at all temperatures, however it is understood that the power amplifier output transistor may comprise HBT or other Bipolar transistors including but not limited to: Si-BJT, GaAs-HBT, InP-HBT, SiGe-HBT circuit devices or similar device technologies. Specifically, it was determined what Icq would be necessary for first and second stages of the P.A. to meet a −46 dBc with only a small 1-2 dB margin at all power levels, and, additionally, to achieve a minimum gain requirement of 25 dB at 28 dBm, and of 10 dB at all power levels was included. As shown in FIG. 5, which is a diagram 140 plotting raw data of Icq1,2 v. Pout (power out) at room temperature for two stage P.A., it was determined that only the second stage bias Icq2 needs to vary with power levels. That is, in a two stage P.A. implementing PCS InGaP devices as shown in FIG. 5, it was determined that from about 15 dBm it is possible to meet the requirement with a lower Icq2 than at lower power levels, as it is very difficult to meet such a requirement as the curve 130 is not monotonous.

As the graph of FIG. 5 depicts, the minimum Icq 130a is constant below about 0 dBm at 11 mA or so. There is a second Icq2 plateau 130b at 26 mA or so from 7 dBm to 19 dbm, before the required Icq2 increases significantly. Rather than implement the Icq changes using Vmode control only, a sliding bias circuit is provided that automatically generates such an Icq2 curve to accommodate the plateau 130b and the rising curve for the Icq2 up to the highest power level. However, it is preferred to use a sliding bias for Icq2 at the higher output power levels coupled with Vmode control at the lower power level to accommodate for plateau 130a, as long as it will not interfere with the sliding bias operation. Table 1 indicates an example product specification including Icq values and changes using Vmode control in a sliding bias circuit.

TABLE 1

Vmode combined with sliding bias

| Vmode | Power levels | Icq-1 | Icq-2 | Total Icq (Ibias not included) |
|---|---|---|---|---|
| 3 V | <5 dBm | 12 mA | 11 mA | ~25 mA |
| 0 V | >5 dBm | 12 mA | 26 mA | ~40 mA |

TABLE 2

Vmode, no sliding bias

| Vmode | Power levels | Icq-1 | Icq-2 | Total Icq (Ibias not included) |
|---|---|---|---|---|
| 3 V | <15 dBm | 12 mA | 26 mA | ~40 mA |
| 0 V | >15 dBm | 12 mA | 90 mA | ~100 mA |

In Table 1, the values of Icq-1 and Icq-2 represent target values achievable by a sliding bias circuit with Vmode control. For example, the value of 26 mA is an approximate minimum for a 28 dBm InGaP CDMA P.A. using efficiency enhancement by bias control. Specifically, the Vmode Table 1 explains that by adding a Vmode switch to the sliding bias circuit, there is provided a very efficient mode of operation. The sliding bias circuit takes care of the increase of current at the highest power level. However, the curve shows that the current can again be reduced at powers below 5 dm approximately. So the combination is preferred for more efficient operation. It is remarkable to compare Table 2 provides the quiescent current values that would result when implementing Vmode system bias control without the sliding bias circuit implemented. As compared to the values in Table 1, the quiescent currents are significantly higher.

It is understood that it is within the purview of skilled artisans to possibly achieve lower values of Icq-2, e.g., using a line-up switching method rather than quiescent current switching.

Figure 6:
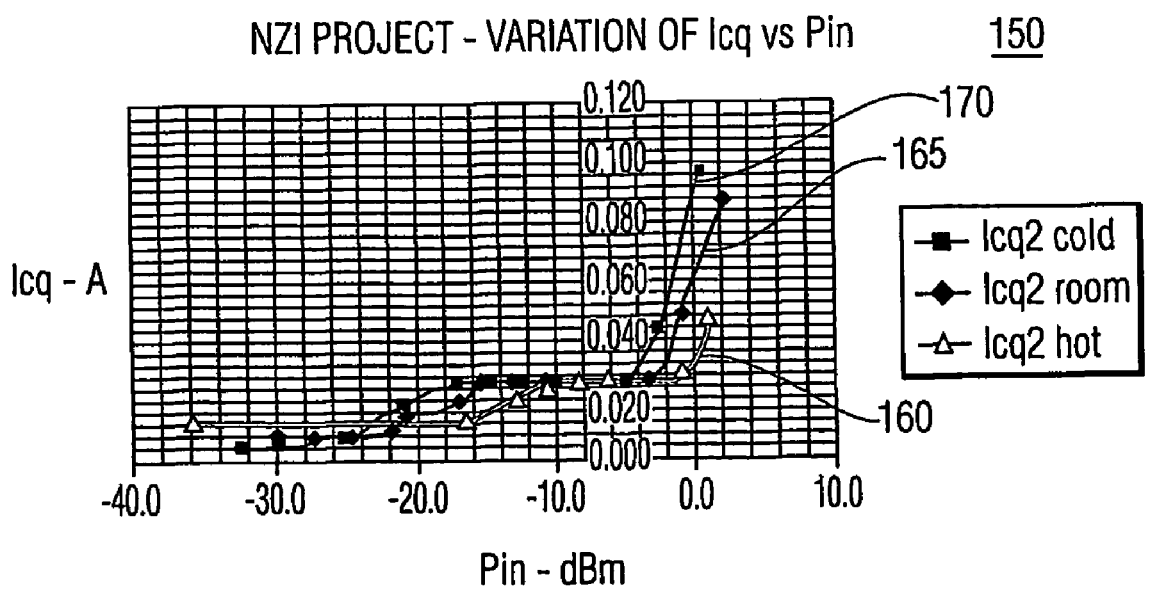
FIG. 6 illustrates a plot 150 of the Icq-2 current values versus the input power of the P.A. (Pin) over three operating temperature conditions.
Figure 7A:
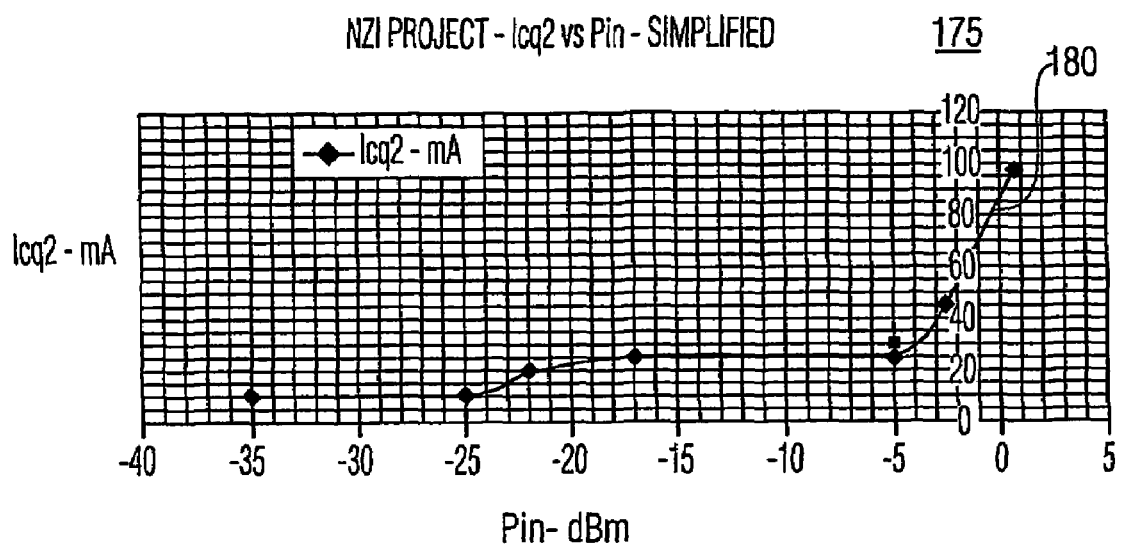
FIG. 7(a) illustrates an Icq-2 current response curve such as curve 180.
Figure 7B:
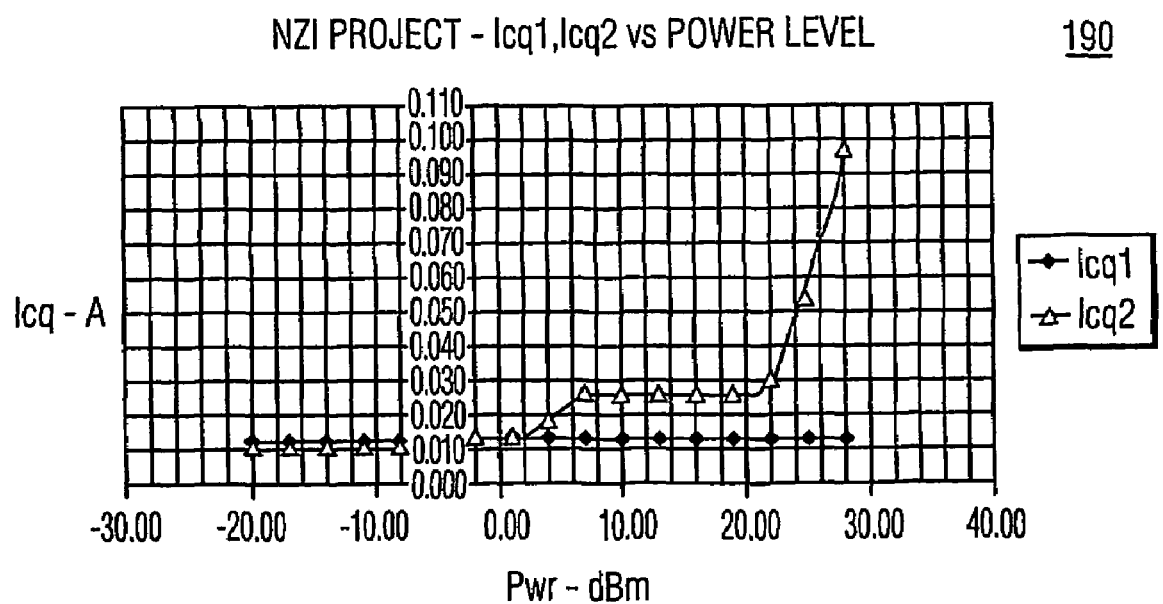
FIG. 7(b) illustrates a plot 190 of the Icq-1 and Icq-2 control curves versus the output power (Pout) of the P.A. with Icq-1 being constant over the operating range and Icq-2 that increases at two regions.

In addition to the use of Vmode Icq-1 and Icq-2 control, the use of a sliding bias circuit requires detection of the input power at the device to control. This requirement comes directly from the variation of the required current with the power level, measured at the input or at the output). As the quiescent current of the 1st stage is not required to change, the power can be advantageously detected at the input using a current detector biased jointly with Q1. As the quiescent current of Q1 is tightly controlled, so will the detector be as well. FIG. 6 illustrates a plot 150 of the Icq-2 current values versus the input power of the P.A. (Pin) over three operating temperature conditions, i.e., hot 160, room temperature 165 and cold 170. FIG. 7(a) particularly illustrates a plot 175 summarizing the Icq-2 current values 180 as function of the input power (Pin) of the P.A. acceptable over all temperatures (hot, room, cold). The sliding bias circuit of the invention is thus configured to achieve an Icq-2 current response curve such as curve 180 shown in FIG. 7(a). FIG. 7(b) illustrates a plot 190 of the Icq-1 and Icq-2 control curves versus the output power (Pout) of the P.A. with Icq-1 being constant over the operating range and Icq-2 shown increasing at two regions. One region which is increasing after 20 dBm is to be handled by the sliding bias circuit and increasing at 5 dBm via Vmode control as in Table 1.

Figure 8:
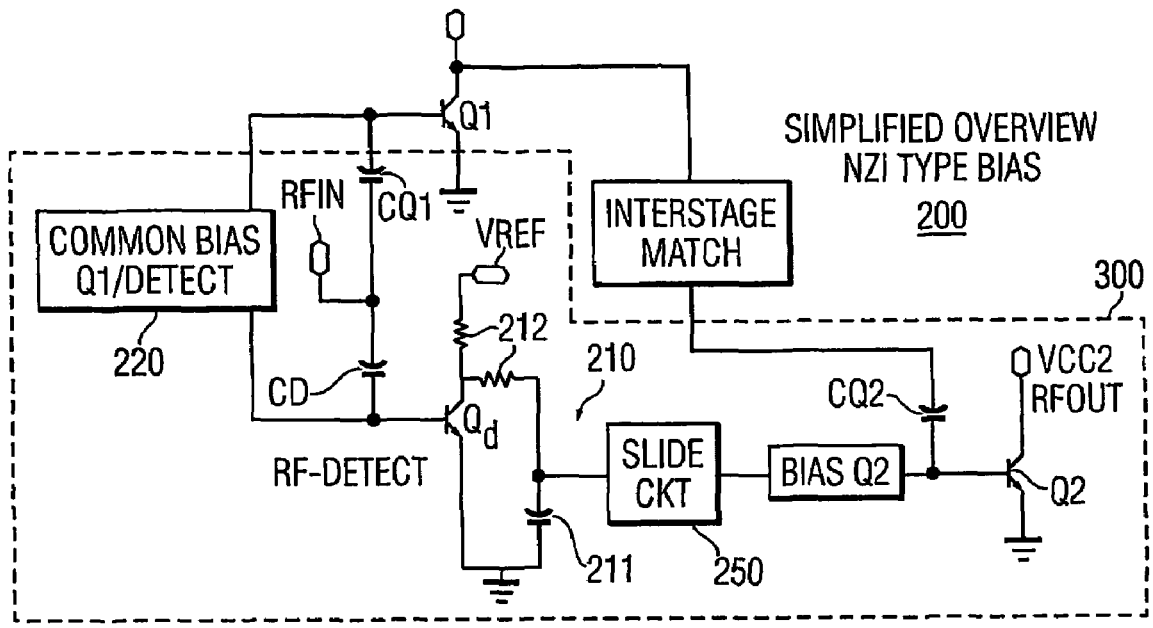
FIG. 8 illustrates a simplified circuit diagram 200 of the P.A. implementing the sliding bias circuit of the invention.

FIG. 8 illustrates a simplified circuit diagram 200 of the P.A. implementing the sliding bias circuit of the invention. As shown in FIG. 8, the P.A. 200 is a class AB type power amplifier as in FIG. 3 depicted as a two stage having gain transistors Q1, Q2 each with a respective coupling capacitor CQ1 and C Q2 for coupling the RF signal, an interstage match, and bias circuits for Q1 and Q2. Additionally included is a sliding bias circuit 250 for modifying the bias of Q2, and as shown in FIG. 8, is illustrated as a separate circuit. It is understood that the Q2 bias and slide circuit may be integrated. As shown in FIG. 8, however, the P.A. 200 additionally includes an RF detect circuit 210 for detecting the incident power on the input of the amplifier. The RF detect circuit 210 particularly mirrors the current through Q1 (RFin) and utilizes the same bias circuit as Q1, represented as a common bias circuit 220. The RF detect circuit 210 comprises a transistor Qd biased at the constant current for class AB operation which, as shown in FIG. 8, is used to drive the sliding bias circuit 250. Thus, when power is input to the transistor, the current through the collector increases. The detected current is modified into a voltage through the resistor 212 at the collector of the detector. The value of this resistor 212 is also a factor in the amplitude of the detection. If no reference voltage is available by the phone, a circuit generating the reference should be provided such as a band gap type circuit. The modified voltage signal at the capacitor 211 increases with increasing RF signal input to the detect circuit 210, i.e., voltage tracks the input RF power level. The resistor 212 and capacitor 211 combination at the output of the detect circuit 210 additionally functions as a filter to remove any RF modulation of the tracked voltage signal so that a modulation signal is not fed into the sliding bias circuit 250.

The value of the averaging capacitor 211 is critical to the behavior of the circuit. Too high a value would make the circuit too slow and therefore not pass the system specification for settling the performance of the P.A.; too low and the detector averaging would not be proper. The lack of averaging may create base band modulation at the input of the sliding bias circuit 250 for Q2. It would then generate some additional Adjacent Channel Power Ratio (ACPR) and the power amplifier would not meet this critical specification.

The detected voltage is used to feed a slide circuit that modifies the quiescent current of Q2 provided by its own bias circuit. There is no modification to the interstage circuit nor the load circuit of Q2.

Figure 9:
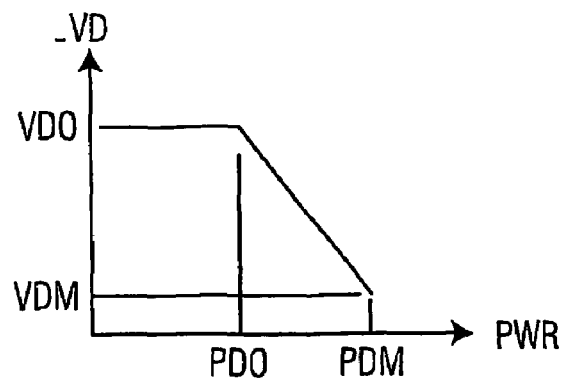
FIG. 9 illustrates the simplified voltage response of the detect circuit 210.

FIG. 9 illustrates the simplified voltage response of the detect circuit 210. The detector transistor Qd is a transistor mirror of Q1 biased with the same current density. The mirror ratio is r=AQd/AQ1 where "A" is the emitter area of the transistor. As shown in the plot of FIG. 9, the maximum voltage VdO is for no power through the detector or, a power under the value PdO at which the base of Qd starts to conduct more current. VdO=Vref−R0*Icqd. Additionally, Icqd=r*Icq1. In general, the value of "AQd", or "r" should be chosen as small as possible to maximize the detector range (maximize "VdO").

As the bias is common with Q1, the current quiescent through the RF detector 210 is very stable with temperature and other variables such as other voltage presented to the P.A. The detector is a mirror of Q1 and as a starting point the value of Cd is proportional to Cq1 with the same mirror ratio. However the input power through the detector 210 may be adjusted by varying the value of detector capacitor Cd so that the detected current starts to slide at the desired level "PdO". In the detector the values of the two resistors 212a, 212b in parallel defines the RF load RLd of the Qd. Again for maximizing the dynamic range of the detector the values of the resistance should be chosen so that RLd= (Vref−Vsat)2/(2*PdM) where "PdM" is the value of the highest power considered at the output of the detector. As a starting point the value of resistor R212a should be chosen so that at the maximum power level VdM=Vref−R212a*IdM (with resistor 212a the resistor connected to Vref); however it can be reduced if the objective is not to maximize detector range or to fit the detected voltage and the slope of the curve to fit the Bias circuit of Q2 and fulfill the quiescent current requirements defined in FIG. 7(*a*).

The input power detected through tapping at the first stage of the P.A. (current detection) is necessary because of the variation of the current required with the power level. The circuit needs to perform at a "slow" speed and kick in when more power is provided at the input of the P.A. (i.e., not at base-band speed). This consideration is very important because any variation Icq at base band would, in turn, change the gain and phase of the stage in consideration, therefore modulate this stage and generate additional energy in the adjacent channels. The ACPR may then be deteriorated significantly. There is a range of detector capacitors 211 that is allowed by the circuit that allows the detector 210 to average the base band signal but be still fast enough to meet the overall system specification. This range may differ on different systems as the base band frequency varies between systems and the time required for a new power level to settle is also different between systems.

At the input of the slide circuit 250, the voltage tracks the input power level. As Qd is a transistor operating in a Class AB configuration, below a certain power level, there will be no detected voltage and after a certain voltage threshold level, the slide circuit 250 will kick in. There may be some shaping of the signal required in the slide circuit 250, e.g., a resistor, to correct the voltage fed to the Q2 bias if necessary. It is preferred that the sliding bias circuit 250 is integrated with the Q2 bias circuit.

Figure 10:
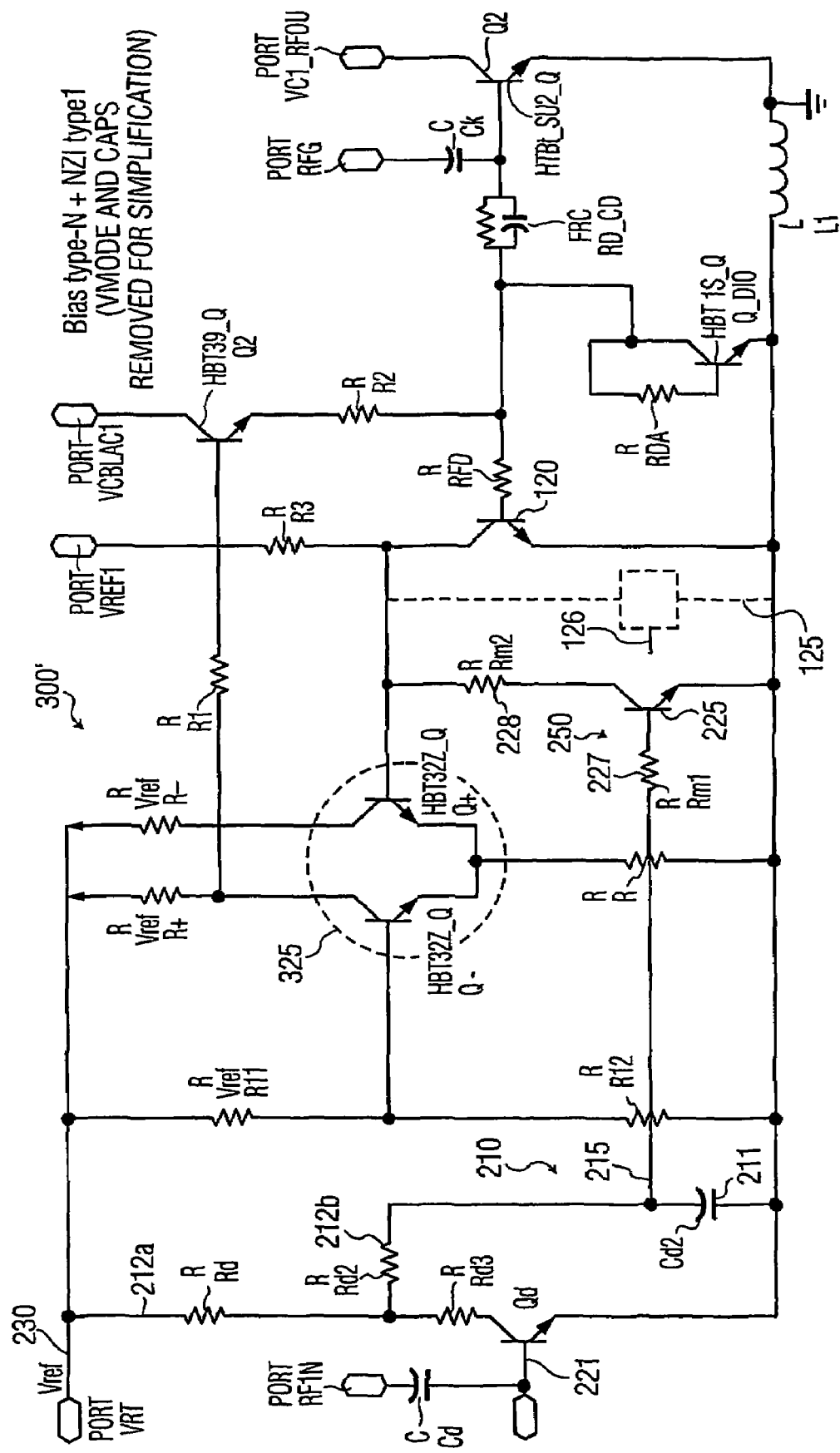
FIG. 10 illustrates a detailed circuit diagram 300' according to a preferred embodiment of the invention.

FIG. 10 is a diagram illustrating a circuit 300' according to a preferred embodiment of the invention that represents a portion of the output Class AB P.A. corresponding to the circuit portion 300 indicated in FIG. 8. The circuit 300' illustrates the power (RF) input detector circuit 210, self-adaptable sliding circuit 250 and Q2 bias circuit according to the invention. The voltage output 215 of the detector circuit 210 is directly affected by the current passing through the detector and is fed into the self-adaptable slide circuit transistor 225 through resistor 227. In operation, when the voltage 215 decreases (with an increase, of power through the detector), the current through transistor 225 will decrease. In turn, the ratio between resistor 228 and transistor 120 is changed, as combination of the differential pair 325 holds the total current through all branches constant, the quiescent current through transistor 120, a mirror of Q2, is changed. Accordingly, the quiescent current Icq-2 through at the output transistor Q2 is automatically changed in the manner described herein, with changing RF input voltage. It should be understood that, in a preferred embodiment, the Vmode transistor 125 shown in FIG. 4 for discretely changing the quiescent current via a Vmode signal 126 may be additionally provided in parallel to the RF detector 210 and self-adaptable bias circuit 250 to provide the additional Vmode discrete quiescent current Icq-2 control. In this embodiment, there are two power ranges where the quiescent current Icq-2 through the output transistor Q2 changes: the self adapting sliding bias circuit will kick in at the higher power level (see (FIG. 7 (b)) and Vmode described in connection with FIG. 4 will kick in at a predetermined threshold dictated by Vmode voltage 126, eg., which is used to lower the Icq current at output power levels lower than a threshold power, e.g., 5 dBm, for example. The voltage at which the self-adapting bias circuit 250 kicks in, and the slope of change, are dependent upon the values of base resistor 227 and collector resistor 228 of the sliding bias circuit transistor 225 and a reference voltage 230 as shown in FIG. 10. Those features are also dependant upon the values chosen for the detector, as it was described herein above. It should be understood that the circuit of FIG. 10 has been modified to omit certain capacitor devices and other circuit elements that aid in the suppression of noise and enhance stability in the output stage circuits.

Figure 1:
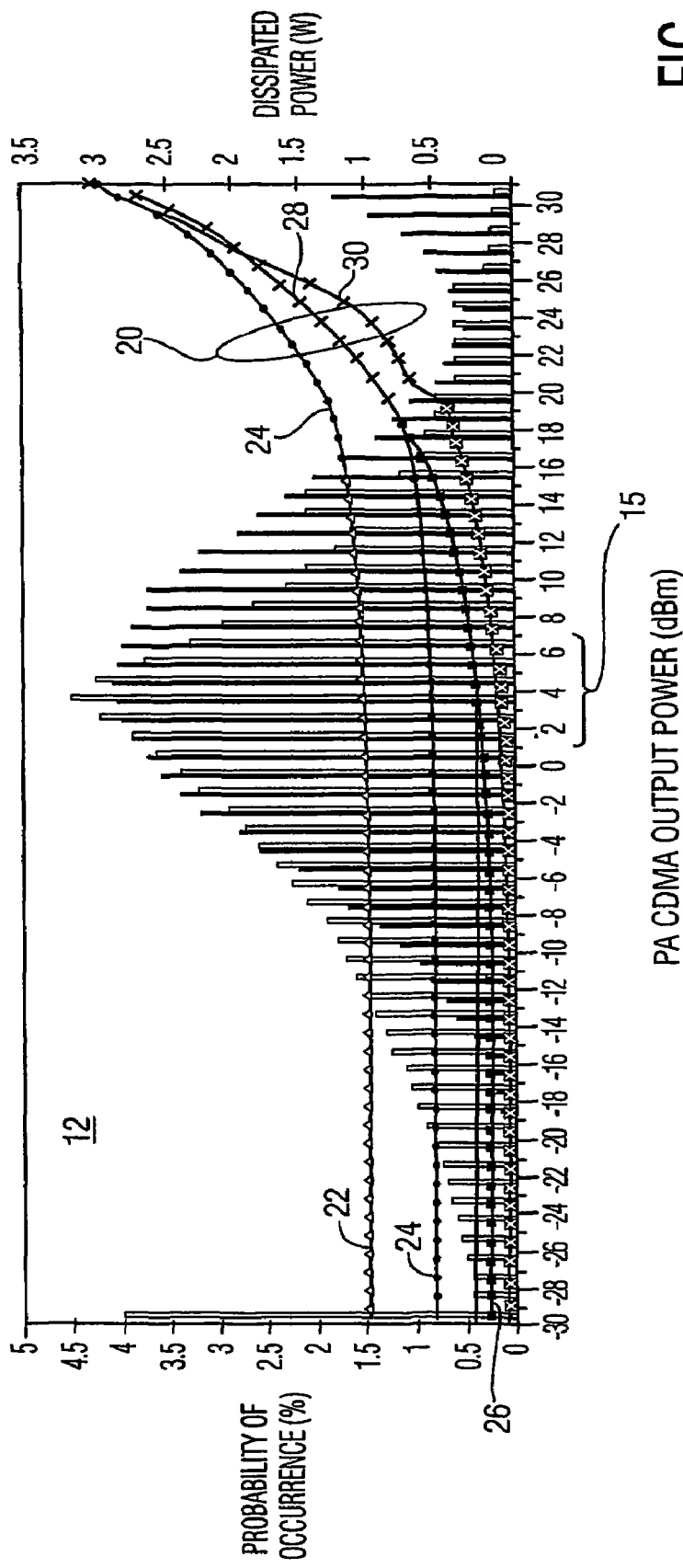
FIG. 1 illustrates a graph 12 of the power used versus the power delivered, i.e., curve represents probability of occurrence of all operating power levels.
Figure 2:
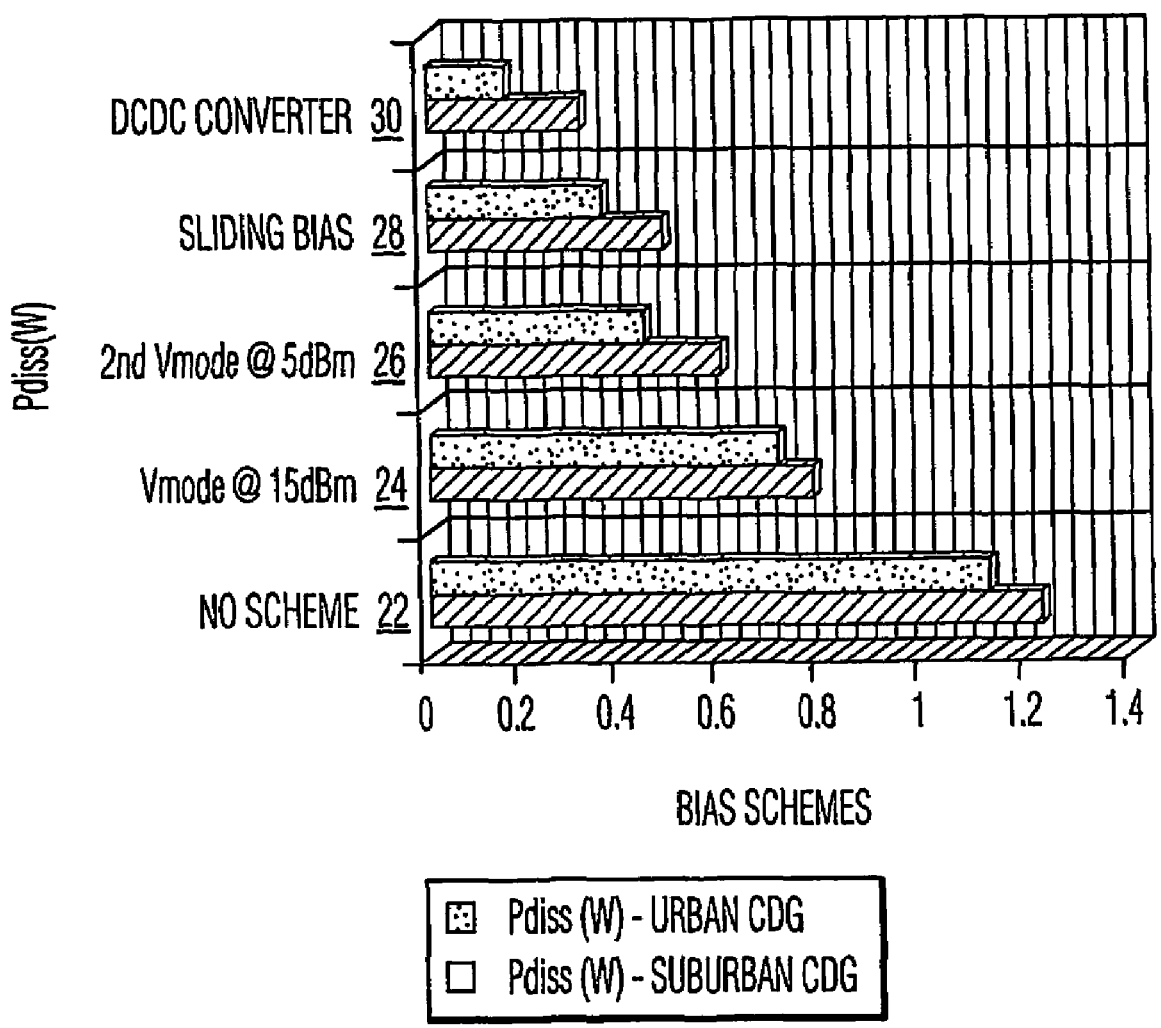
FIG. 2 illustrates a graph depicting the dissipation of power (integrating over all power levels with the current) for each of the curves shown in FIG. 1.

As the detector 210 in the embodiment shown and described with respect to FIG. 10 is connected to the differential pair 325 on the other side through transistor 250, this transistor operates properly in saturation and it is turned on through its diode. Due to this switching operation the operation of this circuit is much more abrupt (faster rate of change while changing the power level) than a sliding bias described in applicants commonly-owned, co-pending U.S. Provisional Patent Application Ser. No. 60/433,752. Hence the response is in between using a Vmode (discrete change) and a sliding bias curve, such as shown in FIG. 1.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

The invention claimed is:

1. A radio frequency (RF) linear power amplifier (200) operating in an output frequency band, having an output transistor (Q2), said power amplifier comprising: (a) a circuit means (300') for generating a bias signal producing a quiescent current flowing through said output transistor (42) of said RF power amplifier,
   b) a detector circuit means (210) for detecting RF input to said amplifier and generating a driving signal (215) according to a power level of said RF input;
   (c) a self-adapting circuit means (250) for receiving said driving signal (215) and automatically modifying said bias signal and said quiescent current through said output transistor (Q2), whereby said quiescent current at said output stage is adjusted for reduced dissipation and increased linearity at all power output levels; and wherein the self-adapting circuit means (250) automatically modifies said quiescent current for an output stage amplifier by tracking detected RF signal being input to the amplifier at power ranges above a certain power output threshold; and wherein the detector circuit means (210) for generating said driving signal (215) is connected to said self adapting circuit means (250), said self adapting circuit means further including means (211, 212) for filtering out any RE component of said driving signal (215).

2. The linear power amplifier as claimed in claim 1, wherein the self adapting circuit means (250) includes means (225,228) for automatically reducing the quiescent current for an output stage amplifier from one state of lower quiescent current to another state of higher quiescent current.

3. The linear power amplifier as claimed in claim 1, comprising first and second power output stages, wherein said detector circuit means (210) detects RF input to said amplifier at said first output stage (Q1), for reducing said quiescent current at a second output stage (Q2).

4. A radio frequency (RF) linear power amplifier (200) operating in an output frequency band, having an output transistor (Q2), said power amplifier comprising: (a) a circuit means (300') for generating a bias signal producing a quiescent current flowing through said output transistor (42) of said RF power amplifier,
 b) a detector circuit means (210) for detecting RF input to said amplifier and generating a driving signal (215) according to a power level of said RF input;
 (c) a self-adapting circuit means (250) for receiving said driving signal (215) and automatically modifying said bias signal and said quiescent current through said output transistor (Q2), whereby said quiescent current at said output stage is adjusted for reduced dissipation and increased linearity at all power output levels; and
 (d) means (125,126) for further modifying said quiescent current at a second output stage under discrete voltage control.

5. A device including a radio frequency linear power amplifier operating in an output frequency band, having an output transistor, said power amplifier comprising:
 (a) a circuit means (300') for generating a bias signal producing a quiescent current flowing through said output transistor (42) of said RF power amplifier;
 (b) a detector circuit means (210) for detecting RF input to said amplifier and generating a driving signal (215) according to a power level of said RF input;
 (c) a self-adapting circuit means (250) for receiving said driving signal (215) and automatically modifying said bias signal and said quiescent current through said output transistor (Q2), whereby said quiescent current at said output stage is adjusted for reduced dissipation and increased linearity at all power output levels; and
 wherein the detector circuit means (210) for generating said driving signal (215) is connected to said self adapting circuit means, said self adapting circuit further including means (211,212) for filtering out any RF component of said driving signal.

6. The device as claimed in claim 5, wherein the self adapting circuit means includes means (225,228) for automatically reducing the quiescent current for an output stage amplifier from one state of lower quiescent current to another state of higher quiescent current.

7. A device including a radio frequency linear power amplifier operating in an output frequency band, having an output transistor, said power amplifier comprising:
 (a) a circuit means (300' for generating a bias signal producing a quiescent current flowing through said output transistor (42) of said RF power amplifier;
 (b) a detector circuit means (210) for detecting RF input to said amplifier and generating a driving signal (215) according to a power level of said RF input;
 (c) a self-adapting circuit means (250) for receiving said driving signal (215) and automatically modifying said bias signal and said quiescent current through said output transistor (Q2), whereby said quiescent current at said output stage is adjusted for reduced dissipation and increased linearity at all power output levels; and
 (d) means (125, 126) for further modifying said quiescent current at a second output stage under discrete voltage control.

8. A self-adapting circuit (250) for dynamically controlling quiescent current flowing through said output transistor of a linear power amplifier operating in an output frequency band, having an output transistor, said linear power amplifier comprising a circuit means (300') for generating a bias signal producing a quiescent current following through said output of said RF power amplifier, said self-adapting bias circuit comprising:
 a) a detector circuit means (210) for detecting RF input to said amplifier and generating a driving signal (215) according to a power level of said RF input;
 b) means (225,228) for receiving said driving signal and automatically modifying said bias signal and said quiescent current through said output transistor, whereby said quiescent current at said output stage is adjusted for reduced dissipation and increased linearity at all power output levels; and
 wherein the detector circuit means (210) for generating said driving signal (215) is connected to said modifying means (225), said detector circuit means (210) further including means (211,212) for filtering out any RF component of said driving signal.

9. The self-adapting circuit as claimed in claim 8, wherein said circuit means for generating a bias signal producing a quiescent current comprises a differential transistor pair (325), said modifying means is connected to one side of said differential pair for automatically modifying said quiescent current for an output stage amplifier according to said detected RF signal input.

10. A self-adapting circuit (250) for dynamically controlling quiescent current flowing through said output transistor of a linear power amplifier operating in an output frequency band, having an output transistor, said linear power amplifier comprising a circuit means (300') for generating a bias signal producing a quiescent current flowing through said output transistor of said RF power amplifier, said self-adapting bias circuit comprising:
 a) a detector circuit means (210) for detecting RF input to said amplifier and generating a driving signal (215) according to a power level of said RF input;
 b) means (225,228) for receiving said driving signal and automatically modifying said bias signal and said quiescent current through said output transistor, whereby said quiescent current at said output stage is adjusted for reduced dissipation and increased linearity at all power output levels; and
 wherein said second power output stage further includes means (125, 126) for further modifying said quiescent current at a second output stage under discrete voltage control.

* * * * *